US005243197A

United States Patent [19]

Van Gorkom et al.

[11] Patent Number: 5,243,197
[45] Date of Patent: Sep. 7, 1993

[54] SEMICONDUCTOR DEVICE FOR GENERATING AN ELECTRON CURRENT

[75] Inventors: Gerardus G. P. Van Gorkom; Aart A. Van Gorkum; Gerjan F. A. Van De Walle; Petrus A. M. Van Der Heide; Arthur M. E. Hoeberechts, all of Eindhoven, Netherlands

[73] Assignee: U.S. Philips Corp., New York, N.Y.

[21] Appl. No.: 970,437

[22] Filed: Nov. 2, 1992

Related U.S. Application Data

[63] Continuation of Ser. No. 827,519, Jan. 27, 1992, abandoned, which is a continuation of Ser. No. 539,095, Jun. 15, 1990, abandoned.

[30] Foreign Application Priority Data

Jun. 23, 1989 [NL] Netherlands ........................ 8901590

[51] Int. Cl.[5] ..................... H01L 29/06; H01L 29/88; H01L 29/90

[52] U.S. Cl. ..................................... 257/10; 257/493; 257/496; 257/603

[58] Field of Search ....................... 357/20, 12, 13, 14, 357/58; 257/10, 493, 496, 603

[56] References Cited

U.S. PATENT DOCUMENTS

| | | | |
|---|---|---|---|
| 4,303,930 | 12/1981 | Van Gorkum et al. | 357/13 |
| 4,801,994 | 1/1989 | Van Gorkum et al. | 357/52 |
| 4,920,387 | 4/1990 | Takasu et al. | 357/17 |
| 4,963,947 | 10/1990 | Beneking | 357/13 |

OTHER PUBLICATIONS

Cooper et al., "Semiconductor Structures for Repeated Velocity Overshoot", IEEE Electron Device Letters, vol. EDL-3, No. 12, Dec. 1982.

*Primary Examiner*—Andrew J. James
*Assistant Examiner*—Ngan Van Ngo
*Attorney, Agent, or Firm*—Steven R. Biren

[57] ABSTRACT

The efficiency of semiconductor cathodes based on avalanche breakdown is enhanced by using "δ-doping" structures. The quantization effects introduced thereby decrease the effective work function. A typical cathode structure has an n-type semiconductor region and a first p-type semiconductor region, with the n-type region having a thickness of at most 4 nanometers.

10 Claims, 1 Drawing Sheet

SEMICONDUCTOR DEVICE FOR GENERATING AN ELECTRON CURRENT

This is a continuation of application Ser. No. 07/827,519 filed on Jan. 27, 1992 now abandoned, which is a continuation of application Ser. No. 07/539,095, filed Jun. 15, 1990 now abandoned.

The invention relates to a semiconductor device for generating an electron current, comprising a cathode having a semiconductor body with at least an n-type semiconductor region and a first p-type semiconductor region, in which electrons leaving the semiconductor body at a surface can be generated in said body by giving the n-type region a positive bias with respect to the p-type region.

The invention also relates to a pick-up tube and a display device provided with such a semiconductor device.

Semiconductor devices of the type described above are known from Netherlands Patent Application no. 7905470, which corresponds to U.S. Pat. No. 4,303,930, by two of the present inventors, the U.S. Patent being incorporated herein by reference.

They are used, inter alia, in cathode ray tubes in which they replace the conventional thermionic cathode in which electron emission is generated by heating. In addition they are used in, for example, apparatus for electron microscopy. In addition to the high energy consumption for the purpose of heating, thermionic cathodes have the drawback that they are not immediately ready for operation because they have to be heated sufficiently before emission occurs. Moreover, the cathode material is eventually lost due to evaporation, so that these cathodes have a limited lifetime.

In order to avoid the heating source which is troublesome in practice and also to mitigate the other drawbacks, research has been done in the field of cold cathodes.

The cold cathodes known from the above-mentioned Patent Application and Patent are based on the emission of electrons from the semiconductor body when a pn junction is operated in the reverse direction in such a manner that avalanche multiplication occurs. Some electrons may then obtain as much kinetic energy as is required to exceed the electron work function; these electrons are then liberated on the surface and thus supply an electron current.

Moreover, the cathodes described in said Patent Application are provided with an acceleration or gate electrode.

In this type of cathodes the aim is to have a maximum possible efficiency, which can be achieved, inter alia, by a minimum possible work function for the electrons. The latter is realized, for example, by providing the surface of the cathode with a layer of material which decreases the work function. Cesium is preferably used for this purpose because it produces a maximum decrease of the electron work function.

However, the use of cesium may have drawbacks. For example, cesium is very sensitive to the presence (in its ambiance) of oxidizing gases (water vapor, oxygen, $CO_2$). Moreover, cesium is fairly volatile, which may be detrimental in those uses in which substrates or compounds are present in the vicinity of the cathode such as may be the case, for example, in electron lithography or electron microscopy. The evaporated cesium may then precipitate on these objects.

In order to try and avoid these problems, Netherlands Patent Application no. 8600675, corresponding to U.S. Pat. No. 4,801,994, proposes to provide an intrinsic semiconductor layer between the p-type region and the n-type region.

The substantially intrinsic layer introduces in the semiconductor device a region which in the operating condition is completely depleted and in which a maximum field strength prevails substantially throughout this region. As a result, the electrons are generated earlier and at a higher potential energy, while the generated electrons in the intrinsic part undergo a slight scattering of ionized dopant atoms so that the effective free path length is increased.

Since electron emission is then also possible as a result of the tunnel effect, a higher efficiency is achieved.

SUMMARY OF THE INVENTION

It is one of the objects of the present invention to enhance the efficiency of such a semiconductor cathode in a different manner.

To this end a semiconductor device according to the invention is characterized in that the n-type region has a thickness of at most 4 nanometers. This thickness is preferably smaller than 2 nanometers.

The invention is based, inter alia, on the recognition that quantization effects occur at such a small thickness (one or several atomic layers) so that the effective work function is decreased.

It is also based on the recognition that the factor $e^{-d/\lambda}$ ($\lambda$: free path length) which also influences the efficiency becomes considerably larger due to a smaller thickness.

The use of such regions with a thickness of one or several atomic layers is possible by providing so-called "δ-doping" or "Planar Doping" structures. Such an n-type (or p-type) layer may comprise a partly intrinsic top layer due to the special way of providing the structures. Where this Application refers to thin n-type or p-type layers, such a double layer of an n-type or p-type layer and a thin intrinsic layer is also included. An intrinsic layer is then understood to mean a $\nu$-type or $\pi$-type layer with a doping of at most $5.10^{16}$ atoms/cm$^3$.

To enhance the efficiency to a further extent, the thin n-type layer may also be deliberately separated from the p-type region by an intrinsic semiconductor layer, similarly as described in Netherlands Patent Application no. 8600675, corresponding to U.S. Pat. No. 4,801,994.

The above-mentioned quantization effects also occur if the thin n-type layer is present between two p-type regions.

A preferred embodiment of the invention is therefore characterized in that the n-type region is present between the first p-type region and a second p-type surface region.

This second p-type surface region has preferably also a thickness of at most 4 nanometers. An additional advantage of such a device is that, notably for silicon, the distance between the bottom of the conduction band and the vacuum level at some distance from the surface is lower for p-type silicon than for n-type silicon. The second p-type surface region preferably has a thickness of at most 2 micrometers, for example, by forming it again as a "Planar Doping" structure. A part of the first p-type region may also be realized in such a manner.

Another preferred embodiment of a semiconductor device according to the invention is characterized in that the surface has an electrically insulating layer in which at least one aperture is provided, while at least one acceleration electrode is arranged on the insulating layer at the edge of the aperture, and the semiconductor structure, at least within the aperture, locally has a lower breakdown voltage than the other part of the semiconductor structure.

Similar advantages (electron beams with a narrow energy spectrum, lens action) as described in Netherlands Patent Application no. 7905470 (U.S. Pat. No. 4,303,930) can be obtained by providing the semiconductor structure with such an acceleration electrode. For electron-optical functions the acceleration electrode may be split up or, if necessary, an extra electrode may be arranged around the acceleration electrode.

A cathode according to the invention may be advantageously used in a pick-up tube, while there are also various uses for a display device comprising a semiconductor cathode according to the invention. One use is, for example, a display tube having a fluorescent screen which is activated by the electron current originating from the semiconductor device.

BRIEF DESCRIPTION OF THE DRAWINGS

Some embodiments of the invention will now be described in greater detail by way of example with reference to the accompanying drawing, in which FIGS. 1*a* and 1*b* diagrammatically show comparisons between the structure of a semiconductor device according to the invention and that of the device described in Netherlands Patent Application no. 7905470 (U.S. Pat. No. 4,303,930).

Figure 1A:
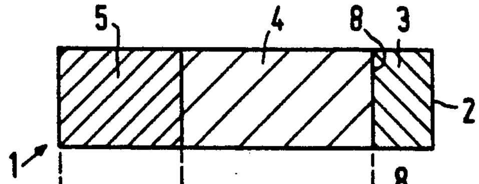
FIG. 1a PRIOR ART

The Figures are shown diagrammatically and are not to scale, in which for the sake of clarity particularly the dimensions in the direction of thickness have been greatly exaggerated. Semiconductor zones of the same conductivity type are generally shaded in the same direction, while corresponding parts in the Figures are generally indicated by the same reference numerals.

DESCRIPTION OF THE PREFERRED EMBODIMENTS

The advantages of a semiconductor device according to the invention will now be described with reference to FIGS. 1 to 3 and compared with those as described in Netherlands Patent Application no. 7905470. The device described in this earlier Application (FIG. 1*a*) comprises at a main surface 2 of a semiconductor body 1 an n-type surface region 3 constituting a pn junction 8 with a p-type region 4. The regions 3 and 4 may be biased in the reverse direction with respect to each other so that avalanche multiplication occurs. A part of the electrons which are then liberated may then obtain as much energy as is required to be emitted from the semiconductor body.

In a first device according to the invention (FIG. 1*b*) the n-type surface region 3 has a thickness of at most 4 nanometers (for example, 2 nanometers). For the sake of the example it has been assumed for the device of FIG. 1 that the p-type region 4 is completely depleted during use. The p-type regions are possibly contacted via a p+ region 5.

Figure 1B:
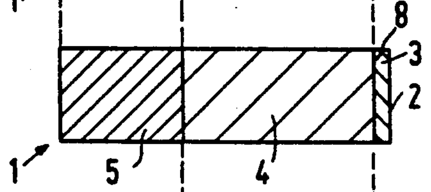
Figure 2:
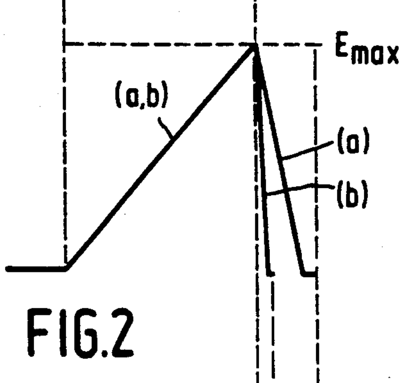
FIG. 2 diagrammatically shows a comparison of the associated prevailing field strength in the semiconductor body.
Figure 3A:
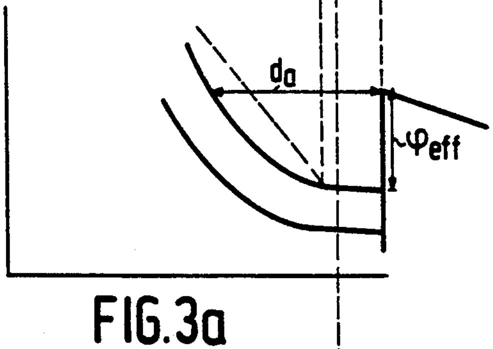
FIGS. 3*a* and 3*b* show diagrammatically the associated energy diagrams.

FIG. 2 shows diagrammatically the variation of the field strength for the two devices. For the devices of FIG. 1 a maximum field occurs at the area of the pn junction 8, which field decreases to the value of zero on both sides of the junction at the edges of the depletion zone (line a, b). Such a field variation leads to an electron energy diagram as is shown by means of drawn lines in FIG. 3*a* for the device of FIG. 1*a*. Viewed from the surface 2, the electron work function is initially zero until it increases in the depletion zone to a value of approximately 0.8 volt (in silicon) at the area of the pn junction. Since it holds that $$E=-(dV/dX)$$

and the field E decreases from this point (see FIG. 2, line a), the curve a in FIG. 3*a* increases less and less steeply from this point until the electron work function remains constant from the edge of the depletion zone.

A similar curve for the device of FIG. 1*b* differs from that of FIG. 3*a* in that the electron work function will steeply increase at approximately 2 nanometers from the surface (see FIG. 3*b*) due to the small thickness of the n-type region 3.

To be able to reach the vacuum, the electrons must have an energy which is at least equal to the emission energy $\phi$. For an electron which has a potential energy which is equal to or higher than this emission energy $\phi$ at a distance x from the surface, the chance of emission is given by $P=Ae^{-x/\lambda}$, where A is a standardizing constant and $\lambda$ is an effective free path length.

For the electrons of the devices described it holds that this chance of electrons just having this potential energy is given by $P_a=Ae^{-d_a/\lambda_a}$ and $P_b=Ae^{-d_b/\lambda_b}$, respectively.

Since $d_b$ in the device according to the invention is small with respect to the thickness $d_a$ in the device of FIG. 1, it holds that $d_b<d_a$, while $\lambda_a\neq\lambda_b$ so that $P_b>P_a$.

Figure 3B:
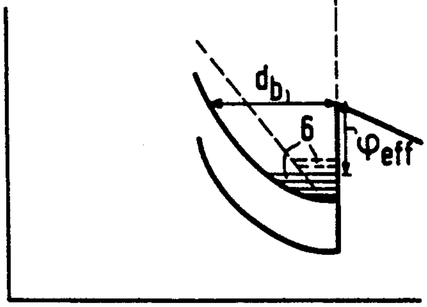

Moreover, due to the small thickness of the layer 3 quantization effects occur, which are shown as discrete levels 6 in the energy diagram of FIG. 3*b*. This results in a decrease of the effective emission energy $\phi$ (distance between the bottom of the conduction band and the vacuum level). Since the total efficiency of the device is determined by $\eta=Ae^{-x/\lambda}\cdot e^{-\phi/kT}$, this leads to a further increase of the efficiency. The efficiency can be even further increased by replacing the p-type region 4 by an intrinsic semiconductor region, similarly as described in Netherlands Patent Application no. 8600675. The associated energy diagrams are denoted by broken lines in FIG. 3. In this case the effective work function is even further reduced because the quantization effects cause a more favorable division of the levels 6.

Figure 4:
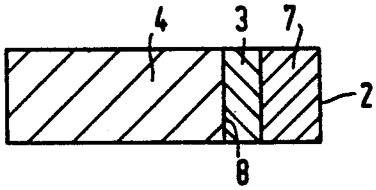
FIG. 4 shows diagrammatically another structure of a semiconductor device according to the invention.
Figure 5A:
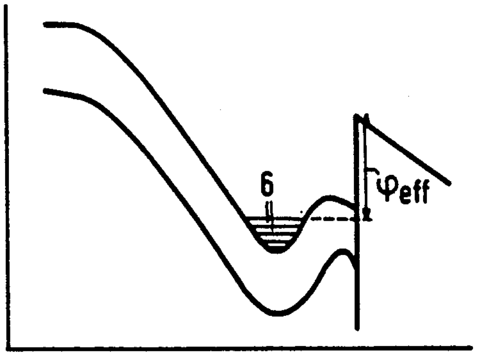
FIGS. 5*a* and 5*b* shows energy diagrams associated with the semiconductor device of FIG. 4.

The effect of these quantization effects can be used to great advantage in the device of FIG. 4 in which a thin n-type region 3 is present between a p-type region 4 and a p-type surface region 7. The n-type region 3 is only several atomic layers thick so that quantization effects occur of the energy levels and the (quasi) Fermi level comes above the bottom of the conduction band of the n-type region 3 (FIG. 5*a*). If the p-type surface region 7 (and hence indirectly the n-type region 3) is given a positive bias with respect to the p-type region 4, so that avalanche multiplication occurs, the electron work function in the region 3 increases until the quasi Fermi level coincides with the bottom of the conduction band of the (preferably highly doped) p-type surface region 7.

Electrons which are generated by simultaneous occurrence of avalanche breakdown of the pn junction 8 fill up the energy levels and cross, as it were, the p-type surface region. To cause a minimum loss of electrons, a small layer thickness (<4 nanometers) and a high doping is preferably chosen for this p-type region.

Figure 5B:
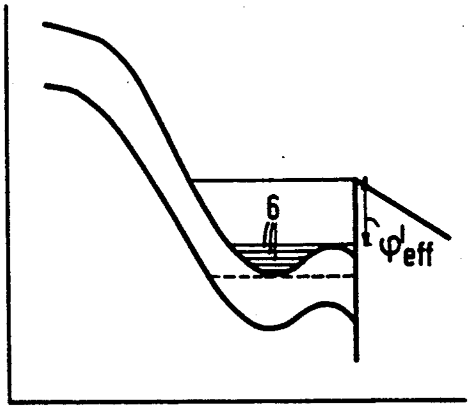

An additional advantage is that the effective work function ($\phi'$ in FIG. 5*b*) for electrons in p-type silicon is lower than that for electrons in n-type silicon ($\phi$, FIG. 5*a*).

Similarly as the region 3, the $p^+$-type surface layer 7 may alternatively be provided by means of techniques resulting in "δ-doping" or "Planar Doping" structures, i.e. techniques which in addition to other suitable techniques (molecular beam epitaxy) can also be used for manufacturing the n-type surface layer 3 in the device of FIG. 1*b*. In this respect it may be advantageous to manufacture the p-type layer 4 and/or possible intermediate intrinsic layers by means of this technique.

As stated above, a semiconductor cathode according to the invention may have an insulating layer at its surface 2 on which acceleration electrodes are arranged around apertures for the purpose of emission; the possible forms of the emitting regions and the acceleration electrodes have been described in greater detail in the above-mentioned Netherlands Patent Application no. 7905470. For example, the aperture may be slit-shaped or circular with a gap width or circle diameter of the same order of magnitude as the thickness of the insulating layer. The semiconductor structure usually has a lower breakdown voltage at the area of such apertures. The acceleration electrode (of, for example polycrystalline silicon) may be split up in different manners in which, for example, a part is located inside and another part is located outside a circular gap. Moreover, the surface may be coated, if desired, with a work function-decreasing material such as cesium or barium. Instead of silicon it is alternatively possible to choose an A3-B5 semiconductor material (gallium arsenide).

Semiconductor cathodes according to the invention can be used in pick-up tubes as well as display tubes, but also, for example in electron microscopy.

We claim:

1. A semiconductor device for generating an electron current in space external to the device, comprising:

a cathode having a semiconductor body with at least an n-type semiconductor region having a thickness of at most four nanometers; and a first p-type semiconductor region;

in which electrons leaving the semiconductor body at a surface can be generated in said body by giving the n-type region a positive bias with respect to the p-type region such that avalanche multiplication occurs.

2. A semiconductor device as claimed in claim 1, characterized in that the thickness of the n-type region is at most 2 nanometers.

3. A semiconductor device as claimed in claim 1 characterized in that a substantially intrinsic semiconductor region is present between the first p-type region and the n-type region.

4. A semiconductor device as claimed in claim 3, characterized in that the substantially intrinsic semiconductor region is of the $\pi$-type or the $\nu$-type with a maximum impurity concentration of $5.10^{16}$ atoms/$cm^3$.

5. A semiconductor device as claimed in claim 1, characteristics in that the n-type region is disposed between the first p-type semiconductor region and a second p-type surface region.

6. A semiconductor device as claimed in claim 5, characterized in that the p-type surface region is highly doped and has a thickness of at most 4 nanometers.

7. A semiconductor device as claimed in claim 6, characterized in that the thickness of the p-type surface region is at most 2 nanometers.

8. A semiconductor device as claimed in claim 6, characterized in that the first p-type semiconductor region is at least partly highly doped over a thickness of at most 4 nanometers.

9. A semiconductor device as claimed in claim 1, characterized in that the semiconductor body consists of a material selected from silicon and a III–V material.

10. A semiconductor device for generating an electron current as claimed in claim 1, wherein said first p-type semiconductor region comprises a lightly doped semiconductor region.

* * * * *